(12) United States Patent
Yabumoto

(10) Patent No.: US 10,680,607 B2
(45) Date of Patent: Jun. 9, 2020

(54) GATE-DRIVE SYSTEM

(71) Applicant: Mitsubishi Electric Corporation, Chiyoda-ku (JP)

(72) Inventor: Takuya Yabumoto, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/349,681

(22) PCT Filed: Oct. 24, 2017

(86) PCT No.: PCT/JP2017/038293
§ 371 (c)(1),
(2) Date: May 14, 2019

(87) PCT Pub. No.: WO2018/116621
PCT Pub. Date: Jun. 28, 2018

(65) Prior Publication Data
US 2019/0363711 A1 Nov. 28, 2019

(30) Foreign Application Priority Data
Dec. 21, 2016 (JP) .................................. 2016-247872

(51) Int. Cl.
*H03K 17/691* (2006.01)
*H02M 1/08* (2006.01)
(Continued)

(52) U.S. Cl.
CPC ............ *H03K 17/691* (2013.01); *H02M 1/08* (2013.01); *H02M 1/12* (2013.01); *H02M 7/515* (2013.01)

(58) Field of Classification Search
CPC ........ H03K 17/691; H02M 1/08; H02M 1/12; H02M 7/515
See application file for complete search history.

(56) References Cited

U.S. PATENT DOCUMENTS 5,422,598 A * 6/1995 Maeda ................. H03G 3/3042
330/136
6,956,427 B2 * 10/2005 Kawasaki ............ H03K 17/063
327/427
(Continued)

FOREIGN PATENT DOCUMENTS

JP 2013-172490 A 9/2013
WO WO 2015/029363 A1 3/2015

OTHER PUBLICATIONS

International Search Report dated Dec. 5, 2017 in PCT/JP2017/038293 filed Oct. 24, 2017.

*Primary Examiner* — Adolf D Berhane
*Assistant Examiner* — Kevin H Sprenger
(74) *Attorney, Agent, or Firm* — Oblon, McClelland, Maier & Neustadt, L.L.P.

(57) ABSTRACT

A gate-drive system according to the present invention which transmits a drive signal to a semiconductor switching device, includes: an inverter circuit to supply high-frequency power including a fundamental wave component and plural harmonic components each having different frequencies; a power transmission circuit which is connected to the inverter circuit and transmits the high-frequency power outputted from the inverter circuit; power receiving circuits to individually receive the fundamental wave component and plural harmonic components of the high-frequency power transmitted from the power transmission circuit; and a control circuit to generate the drive signal for the semiconductor switching device on the basis of the plural harmonic components of the high-frequency power received by the power receiving circuits.

8 Claims, 10 Drawing Sheets

(51) Int. Cl.
*H02M 1/12* (2006.01)
*H02M 7/515* (2007.01)

(56) References Cited

U.S. PATENT DOCUMENTS

| | | | | |
|---|---|---|---|---|
| 9,494,964 | B2* | 11/2016 | Kawai | H02M 1/08 |
| 10,128,832 | B2* | 11/2018 | Xu | H03K 17/56 |
| 2006/0140286 | A1* | 6/2006 | Goto | H02M 1/44 |
| | | | | 375/259 |
| 2015/0234417 | A1 | 8/2015 | Kawai et al. | |
| 2016/0111970 | A1* | 4/2016 | Nate | H02M 1/12 |
| | | | | 315/201 |

* cited by examiner

GATE-DRIVE SYSTEM

TECHNICAL FIELD

The present invention relates to a gate-drive system that supplies gate-drive power and a gate signal to a semiconductor switching device.

BACKGROUND ART

These days, power converters such as inverter circuits are employed in various types of electric apparatuses to meet requirements for power saving etc. A gate-drive system is used to turn on or off a semiconductor switching device employed in the power converter. The gate-drive system controls the semiconductor switching device by supplying a gate signal thereto to turn it on or off in response to a control signal from a control circuit. From a viewpoint of, for example, preventing malfunctions between input side circuits and output side circuits, insulation-type gate drive circuits are employed. One of such insulation-type gate drive circuits proposed includes a technology to transmit gate-drive power and gate-on/off signals in a noncontact manner by electromagnetic field resonance coupling (for example, refer to Patent Document 1).

REFERENCES CITED

Patent Documents

Patent Document 1: Patent Application International Publication No. 2015/029363

SUMMARY OF THE INVENTION

Problems to be Solved by the Invention

In the above-mentioned conventional gate-drive system, a resonant coupler is required for transmitting each of gate-drive power, a gate-on signal, and a gate-off signal, which causes a problem of large size circuits.

The present invention is devised to solve the problem mentioned above and to realize a gate-drive system which can transmit gate-drive power, a gate-on signal, and a gate-off signal in a noncontact manner with its size being small.

Solution to Problems

The gate-drive system according to the present invention is a gate-drive system which transmits a drive signal to a semiconductor switching device, and includes: an inverter circuit to supply high-frequency power including a fundamental wave component and plural harmonic components each having different frequencies; a power transmission circuit which is connected to the inverter circuit and transmits the high-frequency power outputted from the inverter circuit; power receiving circuits to individually receive the fundamental wave component and plural harmonic components of the high-frequency power transmitted from the power transmission circuit; and a control circuit to generate the drive signal for the semiconductor switching device on the basis of the plural harmonic components of the high-frequency power received by the power receiving circuits.

Advantages of the Invention

The gate-drive system according to the present invention is capable of transmitting gate power and gate-on/off signals in a noncontact manner and is capable of being downsized.

DESCRIPTION OF EMBODIMENTS

Embodiment 1

Figure 1:
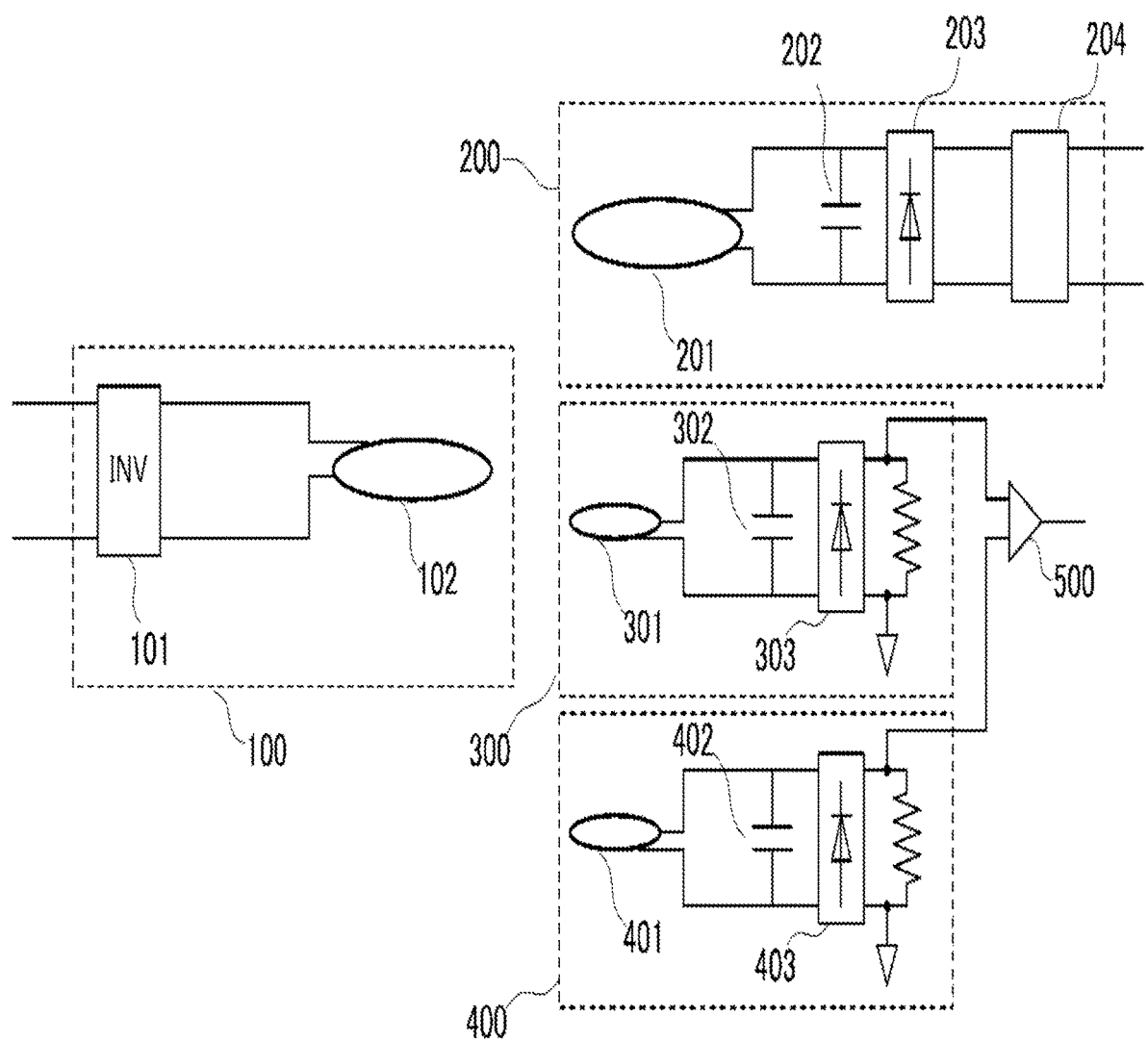
FIG. 1 is a block diagram showing a primary configuration of a gate-drive system according to Embodiment 1 of the present invention.

A gate-drive system according to Embodiment 1 of the present invention is described using figures. FIG. 1 is a block diagram showing a primary configuration of the gate-drive system according to Embodiment 1. In FIG. 1, the gate-drive system includes a power transmission circuit 100, a gate-drive-power receiving circuit 200, an m-th harmonic power receiving circuit 300 and an n-th harmonic power receiving circuit 400. Here, each of m and n is an integer of one or larger, and also m≠n. The gate-drive system is connected to a semiconductor switching device being not illustrated in FIG. 1, and supplies a drive signal to a drive circuit of the semiconductor switching device.

In FIG. 1, the power transmission circuit 100 includes an inverter circuit 101 and a power transmission coil 102. The inverter circuit 101 converts the power inputted from a power supply being not illustrated in FIG. 1 into high-frequency power which includes a fundamental component and plural harmonic components. Note here that the high-frequency power is AC power which includes plural frequency components. Here, the fundamental component of the high-frequency power is a component to contribute to supplying gate-drive power to the semiconductor switching device, and has the same frequency as the drive frequency of the inverter circuit 101. The plural harmonic components are components to contribute to the on/off control of the semiconductor switching device, and have higher order frequencies of the drive frequency of the inverter circuit 101, i.e. frequencies that are integer multiples of the drive frequency of the inverter circuit 101. The power transmission coil 102 is connected subsequently to the inverter circuit 101, to transmit the high-frequency power outputted from the inverter circuit 101 to the gate-drive-power receiving circuit 200, the m-th harmonic power receiving circuit 300, and the n-th harmonic power receiving circuit 400.

The gate-drive-power receiving circuit 200 is a fundamental wave receiving circuit to receive the power of the fundamental wave, and includes a first power-receiving coil 201, a first capacitor 202, a rectifier circuit 203, and a gate-drive power supply circuit 204. The first power-receiving coil 201 receives the fundamental wave component of the high-frequency power transmitted from the power transmission coil 102. The first power-receiving coil 201 is required to receive at least the fundamental wave component, while it may receive other harmonic components. The first capacitor 202 is connected in parallel to the first power-receiving coil 201, and the first capacitor's capacitance value is adjusted so that the first power-receiving coil 201 and the first capacitor 202 can resonate at the fundamental frequency. The rectifier circuit 203 is connected subsequently to the first capacitor 202, to rectify the high-frequency power received by the first power-receiving coil 201. The gate-drive power supply circuit 204 is connected subsequently to the rectifier circuit 203, to supply a gate signal to the gate circuit of the semiconductor switching device which is not illustrated in FIG. 1.

The m-th harmonic power receiving circuit 300 includes a second power-receiving coil 301, a second capacitor 302, and a rectifier circuit 303. The m-th harmonic power receiving circuit 300 is a circuit which is capable of receiving the m-th harmonic component out of frequency components of the high-frequency power transmitted from the power transmission coil 102. In other words, the second power-receiving coil 301 and the second capacitor are adjusted to resonate at the m-th harmonic of the drive frequency of the inverter circuit 101, but so as not to resonate at the n-th harmonic to be described later. The second capacitor 302 is connected subsequently to the second power-receiving coil 301, and constitutes a resonance circuit together with the second power-receiving coil 301. The rectifier circuit 303 is connected to the second capacitor 302, and rectifies the high-frequency wave power received by the second power-receiving coil 301 to output the direct current via the output terminal. The second power-receiving coil 301 and the second capacitor 302 are adjusted so as to resonate with the m-th harmonic of the drive frequency of the inverter circuit 101.

Similarly to the m-th harmonic power receiving circuit 300, the n-th harmonic power receiving circuit 400 includes a third power-receiving coil 401, a third capacitor 402, and a rectifier circuit 403. The n-th harmonic power receiving circuit 400 is a circuit which is capable of receiving the n-th harmonic component out of the high-frequency power transmitted from the power transmission coil 102. In other words, the third power-receiving coil 401 is adjusted to resonate at the n-th harmonic of the drive frequency of the inverter circuit 101, but so as not to resonate at the m-th harmonic. The third capacitor 402 is connected subsequently to the third power-receiving coil 401 to constitute a resonance circuit together with the third power-receiving coil 401, and the third capacitor's capacitance value is adjusted so this resonance circuit can resonate in the n-th harmonic. The rectifier circuit 403 is connected to the third capacitor 402, and rectifies the high-frequency power received by the third power-receiving coil to output the power from the output terminal. The third power-receiving coil 401 and the third capacitor 402 are adjusted so as to resonate at the n-th harmonic of the drive frequency of the inverter circuit 101.

In an on/off determination comparator 500, its one input end is connected to the output end of the m-th harmonic power receiving circuit 300 and the other input end thereof is connected to the output end of the n-th harmonic power receiving circuit 400. The on/off determination comparator compares the outputs (for example, voltage) from the power receiving circuits to output a larger one.

Figure 2:
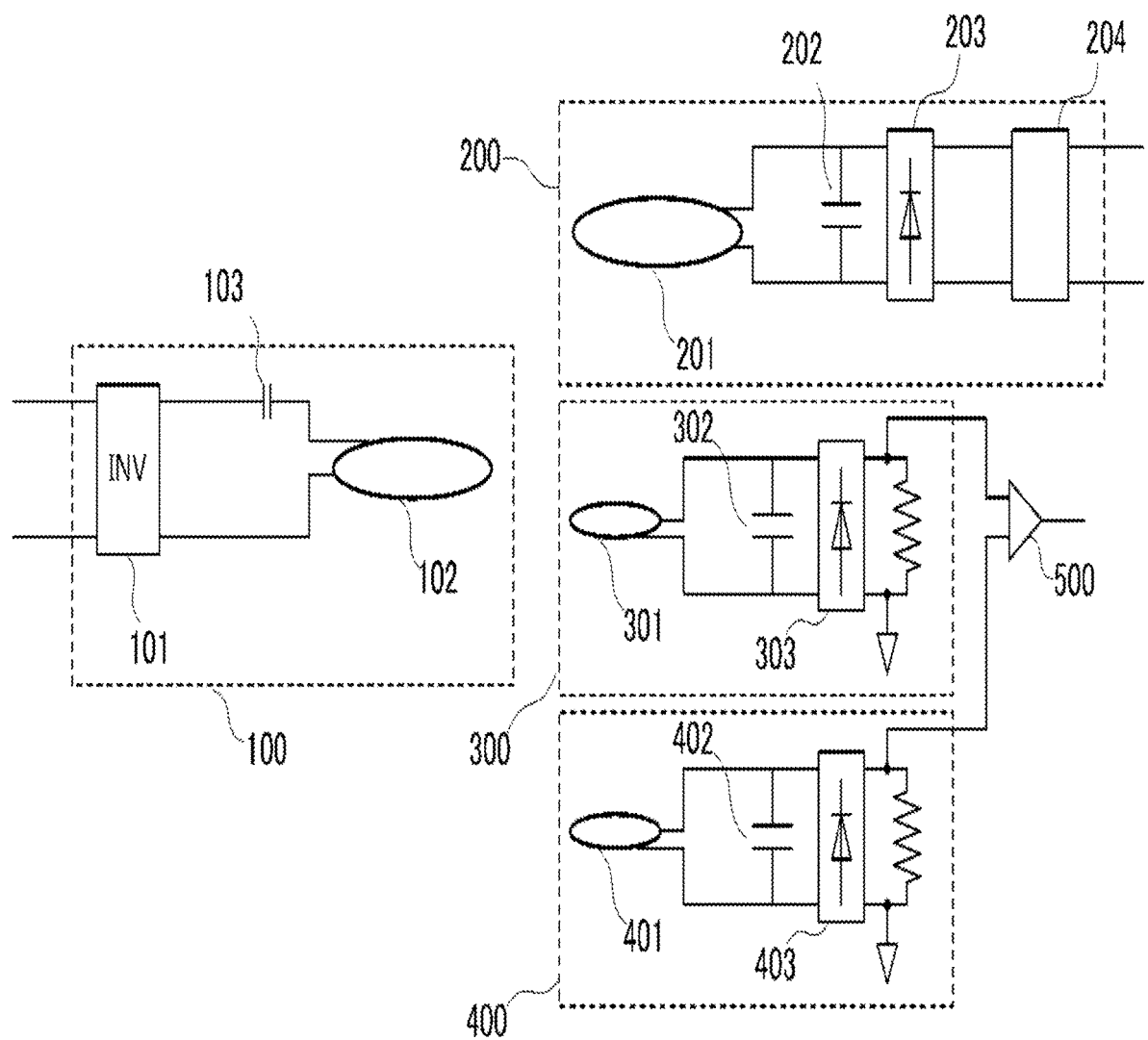
FIG. 2 is a block diagram showing another configuration of the gate-drive system according to Embodiment 1 of the present invention.
Figure 3:
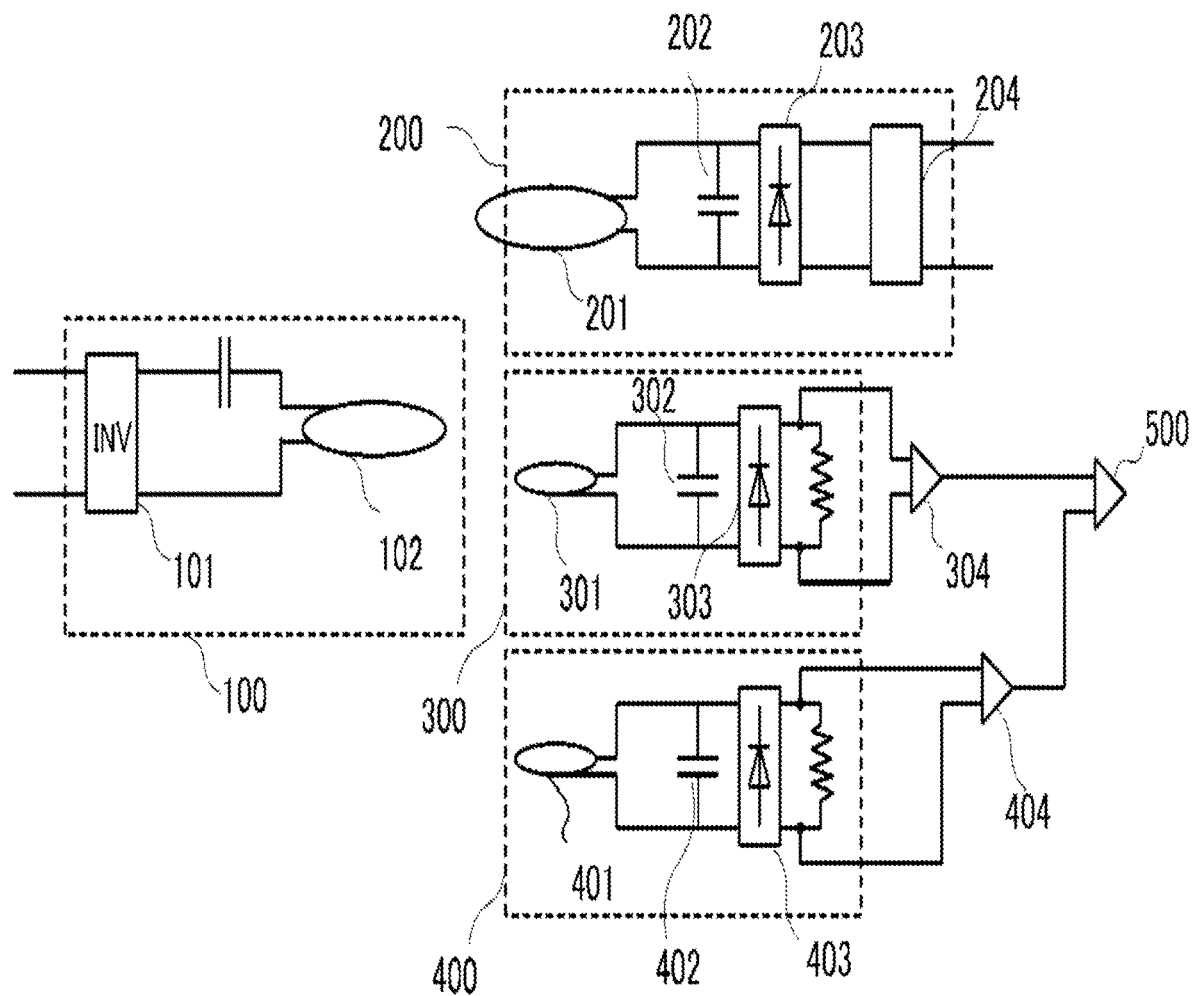
FIG. 3 is a block diagram showing another configuration of the gate-drive system according to Embodiment 1 of the present invention.

Although the power transmission circuit 100 of the gate-drive system according to the present embodiment shown above has a configuration where the inverter circuit 101 and the power transmission coil 102 are directly connected with each other, it is possible to include a capacitor 103 connected in series with the power transmission coil 102, as shown in FIG. 2. Also in FIG. 1 and FIG. 2, the low-electric-potential-side output-end of the m-th harmonic power receiving circuit 300 and the low-electric-potential-side output-end of the n-th harmonic power receiving circuit 400 are connected so as to be at the same electric potential. However, as shown in FIG. 3, a configuration also may be used in which the absolute value of the output from the m-th harmonic power receiving circuit 300 and the absolute value of the output from the n-th harmonic power receiving circuit 400 are to be compared. In the configuration of the gate-drive system shown in FIG. 3, an isolation amplifier 304 is connected to the output end of the m-th harmonic power receiving circuit 300 and an isolation amplifier 404 is connected to the output end of the n-th harmonic power receiving circuit 400. The outputs of the isolation amplifier 304 and the isolation amplifier 404 are connected to the input ends of the on/off determination comparator.

Figure 4:
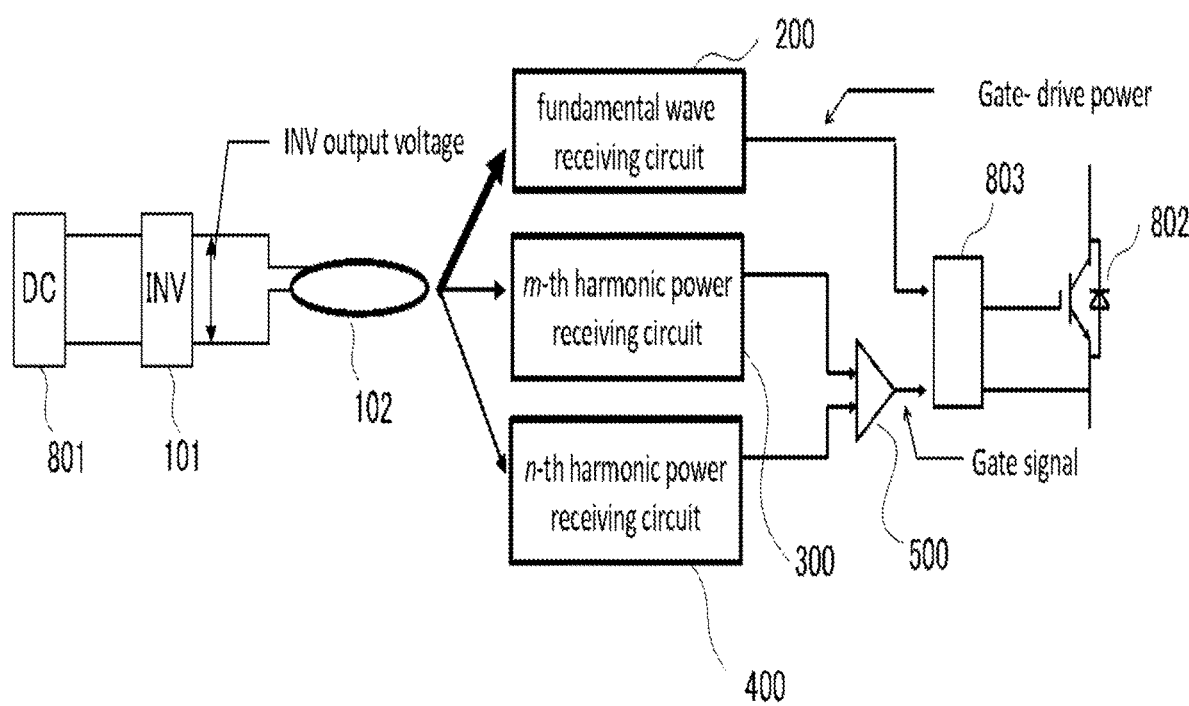
FIG. 4 is a block diagram showing connections between the gate-drive system according to Embodiment 1 of the present invention and its related devices.

FIG. 4 is a diagram showing surrounding connections with which the above mentioned configuration is implemented. The inverter circuit 101 is connected to a DC voltage source 801 and the output of the on/off determination comparator 500 is connected to a drive circuit 803 of a semiconductor switching device 802 such as an Insulated Gate Bipolar Transistor (IGBT) and a Field Effect Transistor (FET). The drive circuit 803 is a control circuit that generates a drive signal of the semiconductor switching device 802 on the basis of the output from the comparator 500. The output of the gate-drive power supply circuit 204 is connected to the drive circuit 803.

Figure 5:
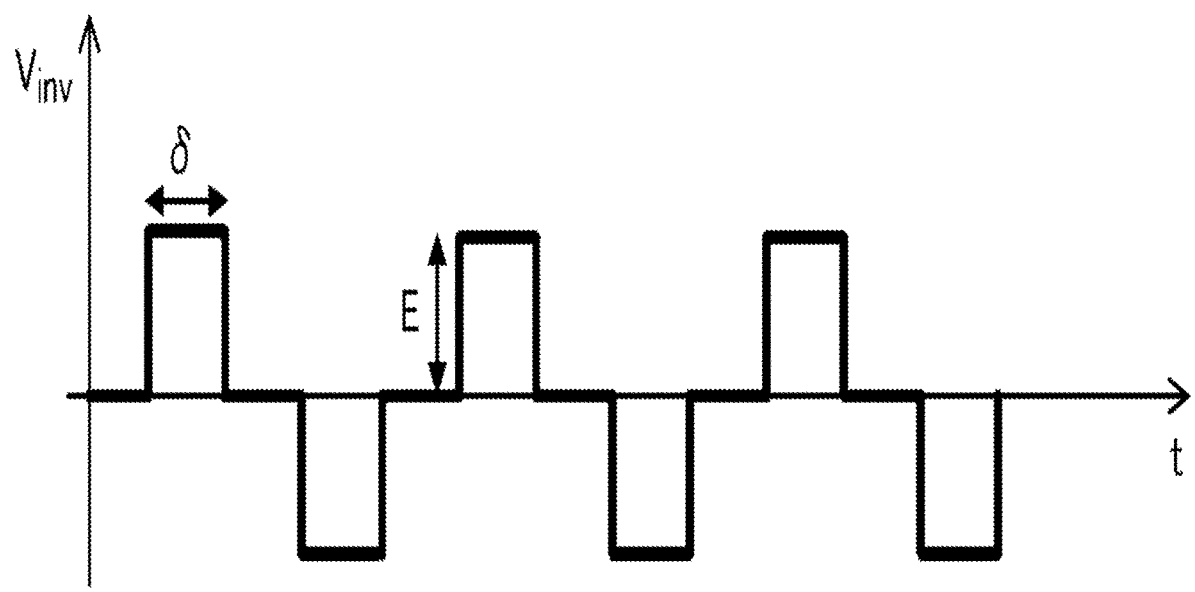
FIG. 5 is a diagram showing rectangular voltage pulses which are outputs of an inverter circuit of the gate-drive system according to Embodiment 1 of the present invention.

Next, the operation of the gate-drive system according to the present embodiment is described. First, the inverter circuit 101, into which DC power is inputted from the DC power supply, converts DC power into AC power, which is to be outputted from its output terminal. Rectangular voltage pulses to be outputted from the inverter circuit 101 and harmonic components thereof are described. The inverter circuit 101 outputs rectangular pulses as shown in FIG. 5. When the power-supply voltage applied to the input of the inverter circuit 101 is denoted by E, a duration when the inverter circuit 101 keeps its output voltage E is denoted by δ [deg], and the angular frequency is denoted by ω, then the rectangular voltage pulses to be outputted from the inverter circuit 101 are represented by the following Formula (1).

[Formula 1]

$$V_{inv} = \frac{4}{\pi}E\sum_{n=1}^{\infty}\frac{(-1)^{n-1}}{2n-1}\sin\frac{(2n-1)\delta}{2}\sin[(2n-1)\omega t] \quad (1)$$

Figure 6:
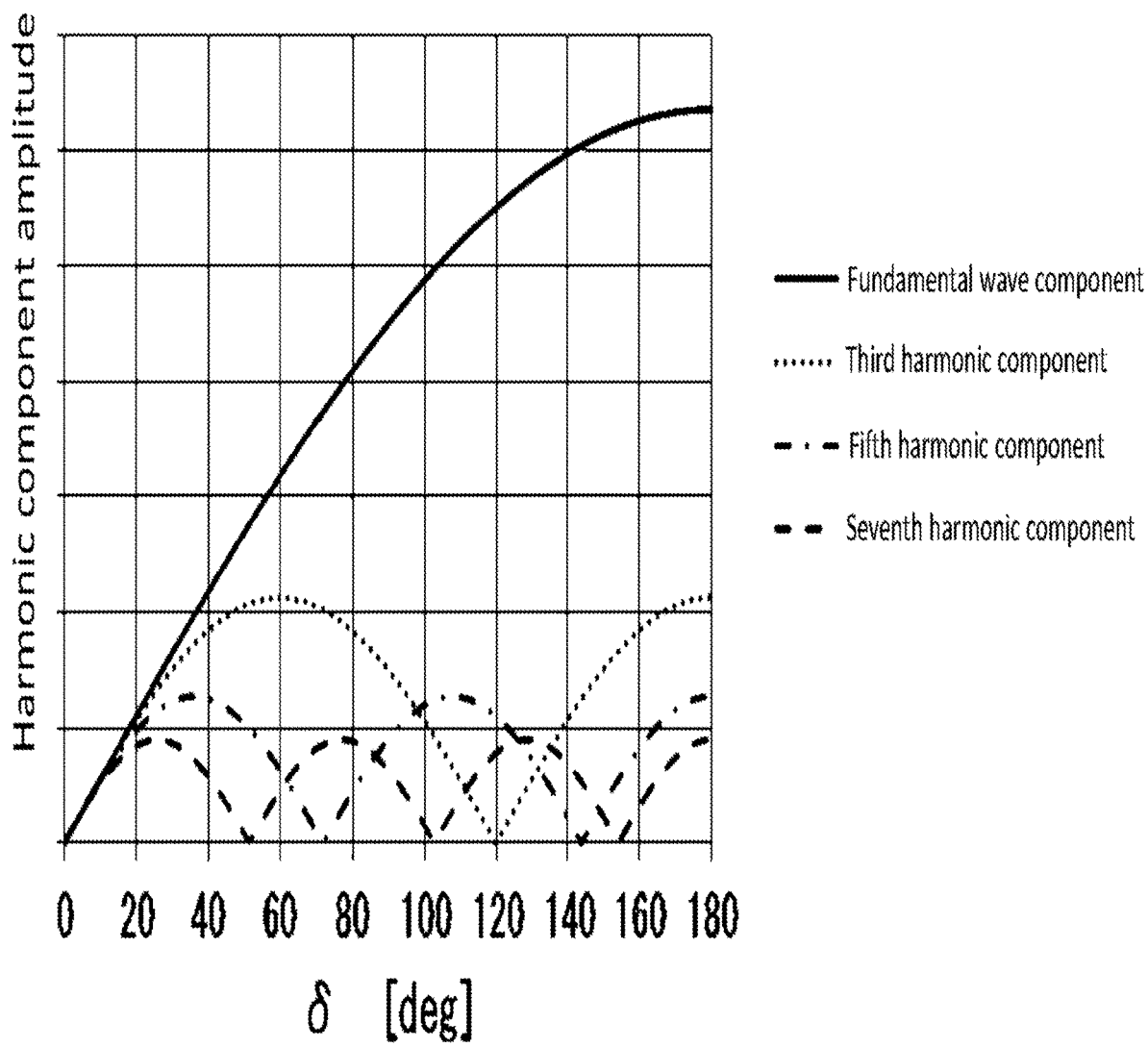
FIG. 6 is a graph showing the relation between harmonic components of the rectangular voltage pulses which are outputs of the inverter circuit of the gate-drive system according to Embodiment 1 of the present invention, and $\delta$.

Formula (1) indicates that the rectangular voltage pulses outputted from the inverter circuit 101 include odd-order harmonic components in addition to the component of the drive frequency (fundamental wave frequency) $f_{inv}(=\omega/2\pi)$ of the inverter circuit. It is also indicated that the odd-order harmonic components can be controlled by the duration $\delta$ during which the output voltage E outputted from the inverter is kept and that a specific harmonic component becomes zero at a specific duration $\delta$. FIG. 6 shows the amplitudes of harmonic components along with $\delta$ [deg], obtained from Formula (1). For example, when $\delta$=120°, the third harmonic component becomes zero.

Next, the power transmission from the power transmission circuit 100 to the gate-drive-power receiving circuit 200 is described. The power input from the DC voltage source 801 into the power transmission circuit 100 is converted to AC power with the drive frequency $f_{inv}$ of the inverter circuit 101, which is fed to the power transmission coil 102. By making a current flow in the power transmission coil 102 at the fundamental wave frequency $f_{inv}$, a high frequency magnetic field with the fundamental wave frequency $f_{inv}$ is generated around the power transmission coil 102. Then, the high frequency magnetic field is interlinked with the first power-receiving coil 201, to thereby generate induced electromotive force at the fundamental wave frequency $f_{inv}$ in the first power-receiving coil 201, whereby the power is transmitted in a noncontact manner. The high-frequency power received by the first power-receiving coil 201 is rectified by the rectifier circuit 203, so that the power is supplied to the gate-drive power supply circuit 204.

Figure 7:
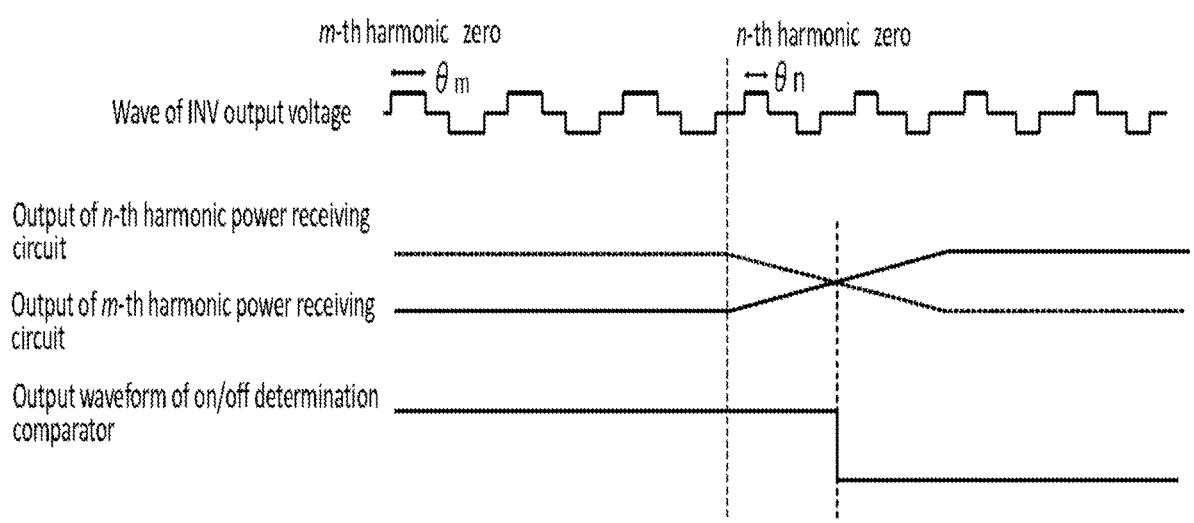
FIG. 7 is a timing chart showing the waveforms at parts of the gate-drive system according to Embodiment 1 of the present invention and the transition between on-state and off-state.

Next, the operation for transmitting an on-signal to the gate of the semiconductor switching device 802 is described using drawings. FIG. 7 is a timing chart showing the waveforms at parts and the transition between on-state and off-state. When transmitting the on-signal to the gate, the rectangular pulse voltage of the inverter circuit 101 is controlled so that $\delta=\theta_m$, at which the m-th harmonic component becomes zero. At this time, in the high frequency magnetic field generated around the power transmission coil 102, there exist the drive frequency component $f_{inv}$ of the inverter circuit 101 and harmonic components excluding the m-th harmonic component. By this drive frequency component being the fundamental wave component of the high-frequency power, the gate-drive power is supplied from the power transmission coil 102 to the gate-drive-power receiving circuit 200. Also, with the n-th harmonic component, power is supplied from the power transmission coil 102 to the n-th harmonic power receiving circuit 400. On the other hand, because the m-th harmonic component is adjusted to be zero, the power transmitted to the m-th harmonic power receiving circuit 300 will be zero, or will become smaller than the power transmitted to the n-th harmonic power receiving circuit 400.

In FIG. 7, graphs in the second row represent the output of the m-th harmonic power receiving circuit 300 and the output of the n-th harmonic power receiving circuit 400. In a period during which the operation is performed under the $\delta$ condition which makes the m-th harmonic be zero, the output from the n-th harmonic power receiving circuit 400 is larger than the output from the m-th harmonic power receiving circuit 300. The output end of the m-th harmonic power receiving circuit 300 and the output end of the n-th harmonic power receiving circuit 400 are connected to the on/off determination comparator 500, which compares the magnitudes of the output of the m-th harmonic power receiving circuit 300 and the output of the n-th harmonic power receiving circuit 400. The output of the n-th harmonic power receiving circuit 400 is larger than the output of the m-th harmonic power receiving circuit 300, so that the on/off determination comparator outputs High (on). In FIG. 7, a graph in the third row represents the output of the on/off determination comparator.

Next, the operation for transmitting an off-signal to the gate of the semiconductor switching device 802 is described. When transmitting the off-signal to the gate, the rectangular voltage pulse of the inverter circuit 101 is controlled so that $\delta=\theta_n$, at which the n-th harmonic component becomes zero. At this moment, in the high frequency magnetic field generated around the power transmission coil 102, there exist the drive frequency component $f_{inv}$ of the inverter circuit 101 and the harmonic components excluding the n-th harmonic component. Similarly to the case of the on-signal transmission, by the drive frequency component being the fundamental wave component of the high-frequency power, the gate-drive power is supplied from the power transmission coil 102 to the gate-drive-power receiving circuit 200. Also, with the m-th harmonic component, power is supplied from the power transmission coil 102 to the m-th harmonic power receiving circuit 300. On the other hand, because the n-th harmonic component is substantially zero, the power transmitted to the n-th harmonic power receiving circuit 400 will be zero, or will become smaller than the power transmitted to the m-th harmonic power receiving circuit 300. The magnitudes of the output of the m-th harmonic power receiving circuit 300 and the output of the n-th harmonic power receiving circuit 400 are compared. The output of the m-th harmonic power receiving circuit 300 is larger than the output of the n-th harmonic power receiving circuit 400, so that the on/off determination comparator 500 outputs Low (off). A third row graph in FIG. 7 shows the transition to the off state in its right side from the middle. Through above operations, it is possible to transmit the gate-drive power, the gate-on-signal, and the gate-off-signal in a noncontact manner.

Next, the advantages of the gate-drive system according to Embodiment 1 of the present invention are described. The gate-drive system according to the present embodiment can transmit the gate-drive power, the gate-on-signal, and the gate-off-signal using one single power transmission coil and does not require modulation circuits. This makes it possible to downsize the gate-drive system in which the power transmission through a non-contact manner is employed. Furthermore, the on-signal and the off-signal can be controlled by the waveform of the rectangular voltage pulse for the inverter circuit 101 and thus other circuits for superposing signals or processing therefor is not required. This enables the cost reduction of the gate-drive system. Since the on/off of the gate is determined by comparing the output of the n-th harmonic power receiving circuit and the output of the m-th harmonic power receiving circuit, it is possible to determine the on/off even in the case when the absolute values of the power received by both circuits vary. Therefore, even when the relative position between the power transmission coil and the power receiving circuits changes, it does not affect the function to transmit gate signals. This enhances the degree of freedom in the position design. With the same reason, a position shift during power transmission is tolerable.

Embodiment 2

Figure 8:
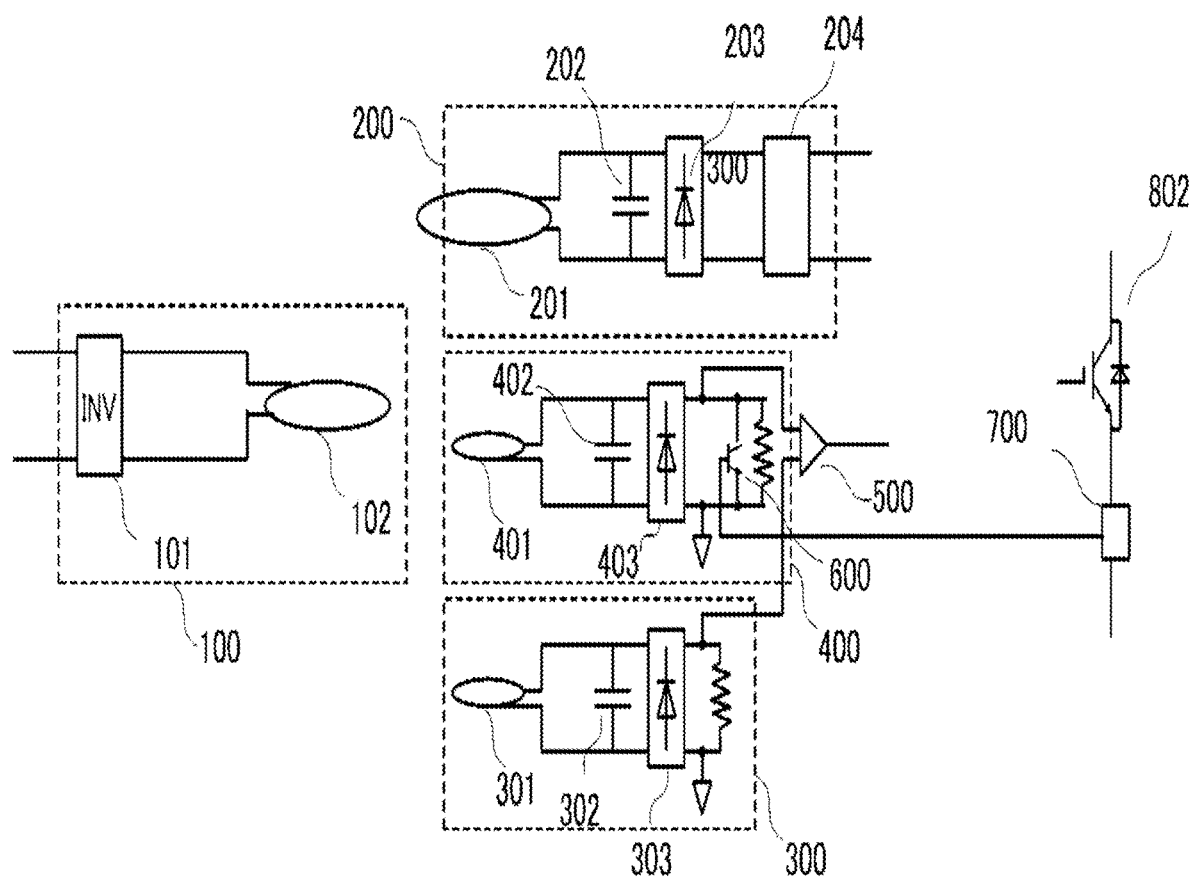
FIG. 8 is a block diagram showing a primary configuration of a gate-drive system according to Embodiment 2 of the present invention.

A gate-drive system to be described in Embodiment 2 has a configuration in which it includes, in addition to the gate-drive system shown in Embodiment 1, a means for protecting the device against overcurrent. FIG. 8 shows the configuration of the gate-drive system according to Embodiment 2. A component in FIG. 8 having the same symbol as that in FIG. 1 or FIG. 4 is a component which is the same or equivalent one that in FIG. 1 or FIG. 4, therefore the description thereof is omitted.

In the gate-drive system shown in FIG. 8, a quick interrupting element 600 is connected to the output end of the n-th harmonic power receiving circuit 400. Also, the gate or the base of the quick interrupting element 600 is connected to an overcurrent detection circuit 700 which monitors the current flowing through the semiconductor switching device 802. The overcurrent detection circuit 700 may include a shunt resistor or a current transformer. The configuration of the overcurrent detection circuit is not limited to a specific one as long as the overcurrent detection circuit can output a signal when the current flowing through the semiconductor switching device 802 becomes an overcurrent, or more specifically, exceeds a current value defined in advance.

Next, the operation of the gate-drive system according to Embodiment 2 is described. Since the operation of transmitting the gate-drive power and the operations of transmitting on/off-signals are the same as those in Embodiment 1, the descriptions thereof are omitted.

When the semiconductor switching device 802 is driven, an overcurrent sometimes flows through the semiconductor switching device 802 to damage the semiconductor switching device 802. A means to avoid such a damage due to overcurrent is then required. In a case where an IGBT is used as the semiconductor switching device 802, the gate-drive system includes an overcurrent detection circuit 700 for the emitter terminal of the IGBT as shown in FIG. 8. When the overcurrent detection circuit 700 detects an overcurrent, it sends a signal to the quick interrupting element 600 which is connected to the output end of the n-th harmonic power receiving circuit 400. Then, the quick interrupting element 600 becomes on-state, so that the output voltage of the n-th harmonic power receiving circuit 400 becomes low. Through this operation, the gate signal can be made "off" immediately after the overcurrent detection without waiting for the off-signal from the power transmission side. This makes it possible to protect the semiconductor switching device 802.

Figure 9:
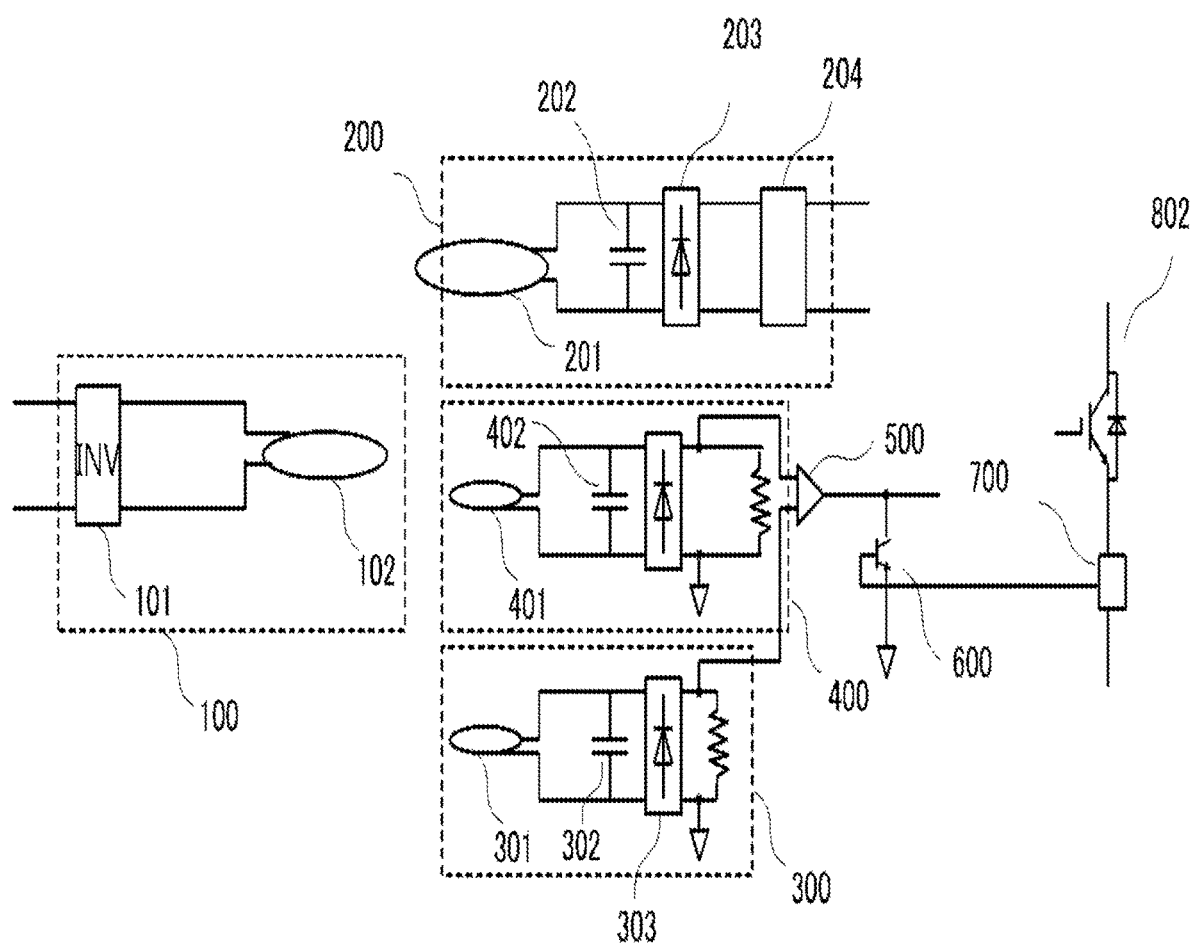
FIG. 9 is a block diagram showing a configuration of another gate-drive system according to Embodiment 2 of the present invention.

Thought a configuration where the quick interrupting element 600 is provided in the n-th harmonic power receiving circuit 400 is described here, it is possible, as shown in FIG. 9, to provide the quick interrupting element 600 connected to the output end of the on/off determination comparator 500. In this case, when the overcurrent detection circuit 700 detects an overcurrent, the gate signal can be made "off" immediately after the overcurrent detection by making the quick interrupting element 600 switch to the off state. This enables the protection of the semiconductor switching device 802 from being broken.

Figure 10:
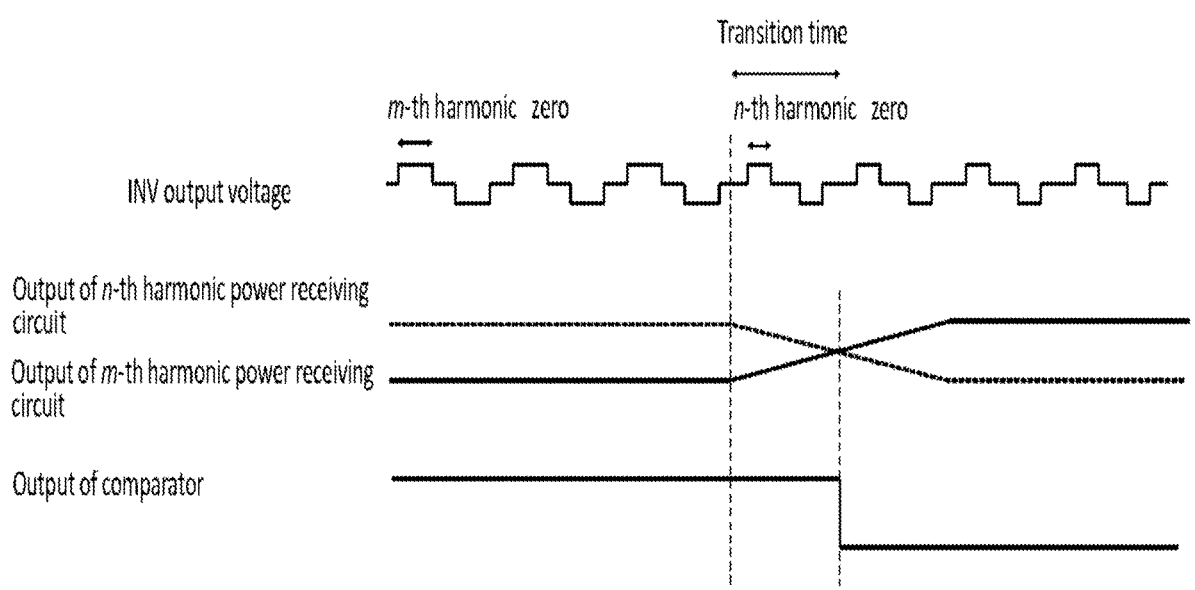
FIG. 10 is a timing chart showing the transition time between on-state and off-state in the gate-drive system according to Embodiment 2 of the present invention.

Next, the advantage of the gate-drive system according to the present embodiment is described. The gate-drive system according to Embodiment 2 of the present invention requires a certain period of time for the gate signal to transition between on/off states. FIG. 10 shows the transition time from an on-state to an off-state. In a case where the gate signal is turned from being on to being off, $\delta$ of the rectangular voltage pulse outputted from the inverter circuit 101 is changed from $\delta=\theta_m$ at which the m-th harmonic component is zero to $\delta=\theta_n$ at which the n-th harmonic component is zero. In response to changing the waveform of the rectangular voltage pulse outputted from the inverter circuit 101, the output of the m-th harmonic power receiving circuit 300 becomes High after a certain delay and the output of the n-th harmonic power receiving circuit 400 becomes Low after a certain delay. This causes the on/off determination comparator's output to transition from High to Low, making the gate signal turn to be off. As described above, there exists some power-receiving-side circuits' response delay from an off-command issued at the power-transmission-side. Therefore, the off-command issue after detecting overcurrent may be too late for turning the gate off. In the present invention, however, the gate-drive power is always supplied in the on state or in the off state. Therefore, the overcurrent detection and the gate-off operation can be performed quickly only by the power receiving side without requiring operations at the power transmission side.

EXPLANATION OF SYMBOLS

100: power transmission circuit, 101: inverter circuit, 102: power transmission coil, 103: capacitor, 200: gate-drive-power receiving circuit (fundamental wave receiving circuit), 201: first power-receiving coil, 202: first capacitor, 203: rectifier circuit, 204: gate-drive power supply circuit, 300: m-th harmonic power receiving circuit, 301: second power-receiving coil, 302: second capacitor, 303: rectifier circuit, 400: n-th harmonic power receiving circuit, 401: third power-receiving coil, 402: third capacitor, 403: rectifier circuit, 500: comparator, 600: quick interrupting element, 700: overcurrent detection circuit, 801: DC voltage source, 802: semiconductor switching device, 803: drive circuit

The invention claimed is:

1. A gate-drive system which transmits a drive signal to a semiconductor switching device, comprising:
   an inverter circuit to supply high-frequency power including a fundamental wave component and plural harmonic components each having different frequencies;
   a power transmission circuit which is connected to the inverter circuit and transmits the high-frequency power outputted from the inverter circuit;
   power receiving circuits, each of which is configured to receive one of the fundamental wave component and the plural harmonic components of the high-frequency power transmitted from the power transmission circuit; and
   a control circuit to generate the drive signal for the semiconductor switching device on the basis of the plural harmonic components of the high-frequency power received by the power receiving circuits, wherein the control circuit includes a comparator to compare voltages of high-frequency power received by a first power receiving circuit of the power receiving circuits that is configured to receive a first plural harmonic component of the plural harmonic components and a second power receiving circuit of the power receiving circuits that is configured to receive a second plural harmonic component of the plural harmonic components, and wherein the control circuit is configure to generate the drive signal to control turning on or turning off of the semiconductor switching device on the basis of the comparison result by the comparator.

2. The gate-drive system according to claim 1,
wherein the inverter circuit supplies the high-frequency power including a drive frequency component of the inverter circuit as the fundamental wave component, the high-frequency power including, when m and n are integers that are equal to or greater than one and that are different from each other, an m-th harmonic component of the drive frequency of the inverter circuit and an n-th harmonic component of the drive frequency of the inverter circuit as the plural harmonic components,
wherein the power receiving circuits include:
a fundamental wave receiving circuit including first power-receiving coil and a first capacitor that are adjusted so as to resonate at the fundamental wave frequency;
an m-th harmonic power receiving circuit including second power-receiving coil and a second capacitor that are adjusted so as to resonate at the m-th harmonic of the drive frequency of the inverter circuit; and
an n-th harmonic power receiving circuit including third power-receiving coil and a third capacitor that are adjusted so as to resonate at the n-th harmonic of the drive frequency of the inverter circuit, and
wherein the comparator compares voltages of high-frequency power received by the m-th harmonic power receiving circuit and the n-th harmonic power receiving circuit.

3. The gate-drive system according to claim 2, wherein when the inverter circuits turns on the semiconductor switching device, the inverter circuits controls a duration of time of its output voltage, so as for the m-th harmonic component of the high-frequency power to be zero, the required duration of time being designed in advance, and
when the inverter circuits turns off the semiconductor switching device, the inverter circuits controls a duration of time of its output voltage, so as for the n-th harmonic component of the high-frequency power to be zero, the required duration of time being designed in advance.

4. The gate-drive system according to claim 3,
wherein the m-th harmonic power receiving circuit and the n-th harmonic power receiving circuit comprise their respective rectifier circuits, one of output ends of the rectifier circuit of the m-th harmonic power receiving circuit being connected to and having the same electric potential as one of output ends of the rectifier circuit of the n-th harmonic power receiving circuit.

5. The gate-drive system according to claim 4, further comprising a quick interrupting switch connected to an output end of the rectifier circuit of the n-th harmonic power receiving circuit.

6. The gate-drive system according to claim 2, further comprising a quick interrupting switch connected to an output end of the comparator.

7. The gate-drive system according to claim 5, further comprising an overcurrent detection circuit for the semiconductor switching device, whose output is connected to a gate or a base of the quick interrupting switch.

8. The gate-drive system according to claim 6, further comprising an overcurrent detection circuit for the semiconductor switching device, whose output is connected to a gate or a base of the quick interrupting switch.

* * * * *